(12) United States Patent
Nagayama

(10) Patent No.: US 6,992,324 B2
(45) Date of Patent: Jan. 31, 2006

(54) ORGANIC SEMICONDUCTOR DEVICE

(75) Inventor: Kenichi Nagayama, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 14 days.

(21) Appl. No.: 10/619,565

(22) Filed: Jul. 16, 2003

(65) Prior Publication Data
US 2004/0012017 A1   Jan. 22, 2004

(30) Foreign Application Priority Data
Jul. 17, 2002 (JP) .............................. 2002-208210
Jul. 17, 2002 (JP) .............................. 2002-208211

(51) Int. Cl.
H01L 35/24 (2006.01)

(52) U.S. Cl. ........................ 257/40; 257/741
(58) Field of Classification Search .................. 257/40, 257/741
See application file for complete search history.

(56) References Cited

U.S. PATENT DOCUMENTS 5,854,139 A * 12/1998 Aratani et al. ............... 438/780
6,503,644 B2 * 1/2003 Schoo et al. ................. 428/690

* cited by examiner

Primary Examiner—Sara Crane
(74) Attorney, Agent, or Firm—McGinn IP Law Group, PLLC

(57) ABSTRACT

An organic semiconductor device includes an organic semiconductor layer with carrier mobility which is deposited between a pair of electrodes facing each other. At least one of the electrodes includes a carrier relay layer which is in contact with the organic semiconductor layer and has a work function close or equal to an ionized potential of the organic semiconductor layer, and a conductive layer which is formed on the carrier relay layer and has lower resistivity than the carrier relay layer.

13 Claims, 9 Drawing Sheets

ORGANIC SEMICONDUCTOR DEVICE

BACKGROUND OF THE INVENTION

1. Field of the Invention

The present invention relates to an organic semiconductor device which comprises an organic semiconductor layer of an organic compound, wherein an organic compound having carrier mobility is used.

2. Description of the Related Art

An inorganic semiconductor, e.g., silicon plays a major role in semiconductor devices, since multiple functions such as high carrier mobility, low dark current, low driving voltage, and a complicated device structure are required for semiconductors used as a diode, a switching device for signal processing, and an amplifying transistor.

In the field of organic semiconductors, an organic electroluminescence device utilizing a photoelectric conversion feature is under development. Furthermore, application of a voltage across the organic semiconductor thin-film increases carrier density, which permits flow of an electrical current between a pair of electrodes provided on an organic semiconductor thin-film. For example, switching over the electrical current that flows in a direction of the organic semiconductor thin-film can be achieved, by means of a source electrode and a drain electrode provided on the organic semiconductor thin-film, and by means of the gate electrode provided therebetween so as to apply a voltage across a thickness direction of the thin-film. Accordingly, research has been conducted on an organic transistor, which permits gradual utilization of the organic semiconductors in technical fields such as transmitting, processing, and recording and displaying of information. In such technical fields, an electrical signal is used for controlling electron carriers and hole carriers within the organic semiconductor at a junction interface between a metal and an organic semiconductor or between one organic semiconductor and another organic semiconductor.

Structure of an organic MOS-TFT using an organic semiconductor thin-film can be provided by, for example, a bottom-contact type or a top-contact type MOS-TFT. Each organic MOS-TFT comprises a gate electrode, a gate insulator layer, a source electrode and a drain electrode, and an organic semiconductor layer, which are formed on a substrate. Material used for the gate electrode is Ni, Cr or the like, and material used for the gate insulator layer is a metal oxide such as $SiO_2$ or SiN, inorganic material such as a nitride, or a resin such as PMMA, and material used for the organic semiconductor layer is pentacene or the like. A layer comprising an elemental metal such as Pd or Au is used for the source electrode and the drain electrode.

However, when the layer comprising an elemental metal such as Pd or Au is used for the source electrode and the drain electrode, the organic semiconductor device has the following problems which impede the practical application of the device:

1) patterning of the electrodes is very difficult, because extremely strong acid such as aqua regia is necessary for wet-etching on Pd or Au, which may damage the base layer such as the gate electrode during the etching process;

2) the device has low reliability because the thin-film of Pd or Au has low adhesion to the base layer film;

3) Pd and Au have a low Clarke number, therefore they are expensive; and

4) Pd has higher electrical resistivity than material normally used for the electrode such as Al.

SUMMARY OF THE INVENTION

It is therefore an object of the present invention to provide an organic semiconductor device with improved adhesion to an electrode, an improved etching feature, and a low resistance.

An organic semiconductor device according to the invention comprises an organic semiconductor layer with carrier mobility which is deposited between a pair of electrodes facing each other, wherein at least one of the electrodes includes a carrier relay layer which is in contact with the organic semiconductor layer and has a work function close or equal to an ionized potential of the organic semiconductor layer, and a conductive layer which is formed on the carrier relay layer and has lower resistivity than the carrier relay layer.

An organic semiconductor device according to the present invention comprises an organic semiconductor layer with carrier mobility which is deposited between a pair of electrodes facing each other, wherein at least one of the electrodes is made by an alloy layer which is in contact with the organic semiconductor layer, and the alloy layer includes a first metal having a work function close or equal to an ionized potential of the organic semiconductor layer, and a second metal having lower resistivity than the first metal.

DETAILED DESCRIPTION OF THE INVENTION

Embodiments of organic transistors as examples of organic semiconductor devices according to the present invention will be described with reference to the drawings.

Figure 1:
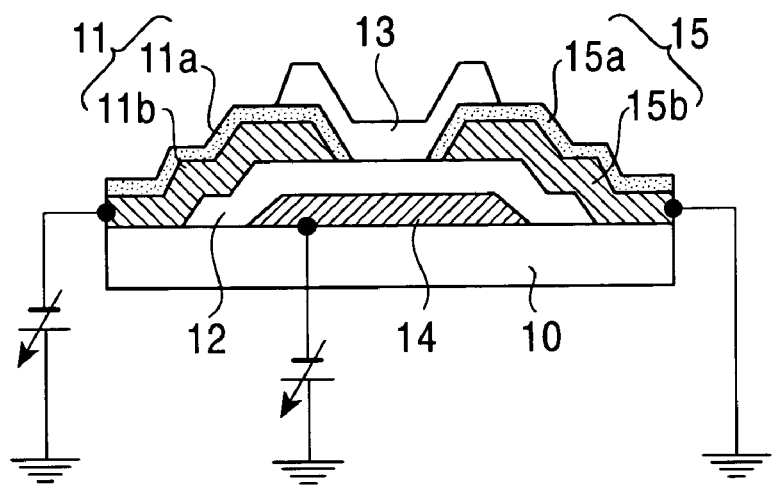
FIG. 1 is a cross sectional view showing an organic transistor according to an embodiment of the present invention.

FIG. 1 shows a bottom-contact type organic transistor according to an embodiment of the invention. The organic transistor includes a gate electrode 14 formed on a substrate 10, a gate insulator layer 12 formed thereon, an organic semiconductor layer 13 formed thereon which is made of organic compound having carrier mobility such as pentacene, and a source electrode 11 and a drain electrode 15 which are both formed so as to contact the organic semiconductor layer 13. The substrate 10 is made of material having an insulating property such as glass. The source electrode 11 and the drain electrode 15 respectively comprise carrier relay layers 11a and 15a, and conductive layers 11b and 15b deposited on the carrier relay layers. The gate electrode 14 applies a voltage to the organic semiconductor layer 13 which is provided between the source electrode 11 and the drain electrode 15 facing each other.

Figure 2:
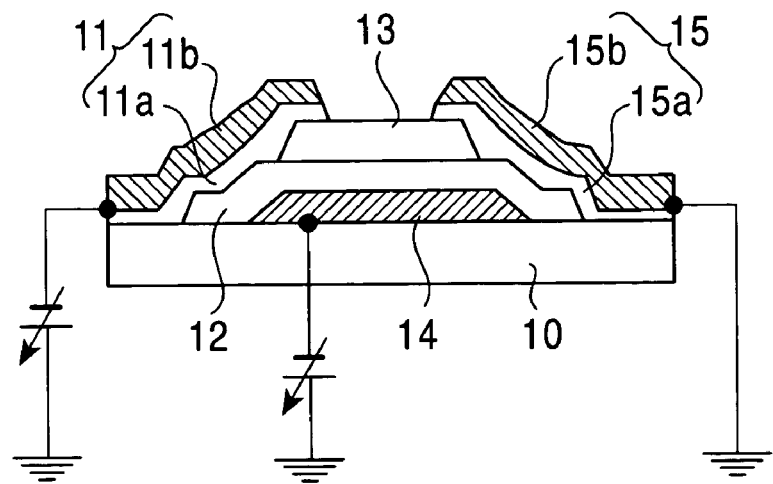
FIG. 2 is a cross sectional view showing an organic transistor according to another embodiment of the present invention.

FIG. 2 shows a top-contact type organic transistor according to another embodiment of the invention. Structure of the top-contact type device is the same as that of the bottom-contact type shown in FIG. 1 except for the forming order in which the organic semiconductor layer 13 is firstly deposited, thereafter the source electrode 11 and the drain electrode 15 are deposited thereon, and also except for the forming order in which the carrier relay layers 11a and 15a are firstly deposited, thereafter the conductive layers 11b and 15b are deposited.

The organic semiconductor layer 13 is made of an organic compound that has a capability to transport holes br electrons when a voltage is applied thereto. The organic semiconductor layer 13 may also have a multilayered structure which comprises thin-films of organic compounds each having a carrier transporting capability. A fused ring such as anthracene or tetracene can be alternatively used for the organic semiconductor in addition to pentacene having a higher carrier mobility.

Material normally used for electrode such as Al, Cu, Ni or Cr, or an alloy thereof is used for the gate electrode 14, when the gate electrode is configured to apply a voltage via the gate insulator layer 12.

It is required that a work function of material used for the source electrode 11 and the drain electrode 15 is close or equal to an ionized potential of the organic semiconductor, in order to decrease an electron injection barrier between the electrodes and the organic semiconductor. For example, as shown in FIG. 1, laminated layers 11a and 11b and laminated layers 15a and 15b that are configured to have two or more types of metal layers and are respectively used for the source electrode 11 and the drain electrode 15, so as to provide for the work function to be close or equal to the ionized potential of the organic semiconductor. Specifically, the source electrode 11 includes a carrier relay layer 11a which is in contact with the organic semiconductor layer 13 and has a work function close or equal to the ionized potential of the organic semiconductor layer, and a conductive layer 11b which is formed on the carrier relay layer 11a and has lower resistivity than the carrier relay layer. Similarly, the drain electrode 15 includes a carrier relay layer 15a which is in contact with the organic semiconductor layer 13 and has a work function close or equal to the ionized potential of the organic semiconductor layer, and a conductive layer 15b which is formed on the carrier relay layer 15a and has lower resistivity than the carrier relay layer.

It is especially important that the work function of the carrier relay layers 11a and 15a has a feature of being close or equal to the ionized potential of the organic semiconductor so that the carrier permits movement through the organic semiconductor. Therefore, it is preferable to provide the carrier relay layer as a metal layer which includes at least one material having a work function close or equal to the ionized potential of the organic semiconductor, and to provide the conductive layers 11b and 15b by material which compensates for the features not achieved by the carrier relay layers. When the layered configuration with two types of metal layers is insufficient to improve such features, the layered configuration may include three or more types of metal layers to further improve the features. Although the carrier relay layers 11a and 15a of the source electrode and the drain electrode are provided on a conducting side of the organic semiconductor layer in order to decrease an electron injection barrier to the organic semiconductor layer, at least one electrode of the pair of electrodes may include a carrier relay layer which is in contact with the organic semiconductor layer and has a work function close or equal to the ionized potential of the organic semiconductor layer, and a conductive layer which is formed on the carrier relay layer and has lower resistivity than the carrier relay layer.

A metal, an alloy or the like which includes at least one material having a work function close or equal to the ionized potential of the organic semiconductor is used for the carrier relay layers 11a and 15a. The work function of the material included in the carrier relay layer is preferably within a range of ±1 eV, and more preferably within a range of ±0.5 eV with a center of the range corresponding to the ionized potential of the organic semiconductor to be utilized.

When, for example, pentacene which is a typical organic semiconductor material having an ionized potential at 5.06 eV is used for the organic semiconductor layer, a work function of the material included in the carrier relay layer is preferably within the range from 4.56 to 5.56 eV. Examples of metals satisfying the above property are Rh, Ir, Ni, Pd, Pt, Au, As, Se, Te and the like. An elemental metal described above or an alloy including a plurality of such metals can be utilized for the carrier relay layer.

A metal having at least one excellent feature in terms of lower specific resistance than the carrier relay layer, better etching feature which permits minute pattering, or stronger adhesion, is used for the conductive layers 11b and 15b. When metal layers are laminated on the conductive layer in the order of a second, a third, a fourth and a fifth metal, a metal having at least one excellent feature in terms of the following features is used for each metal: lower specific resistance than the carrier relay layer, better etching feature, or stronger adhesion throughout the layer to a base layer such as the gate insulator layer 12 in the case of FIG. 1.

Examples of metals having lower specific resistance are Al, Cu, Ag, Mo, W, Mg, Zn and the like. Among these metals, Al, Cu and Ag which have especially lower specific resistance, and an alloy thereof are preferable for the conductive layers 11b and 15b.

Materials such as Al, Cu, Ag, Ni or Mo which have a capability to be dissolved in an acid mainly including a phosphoric acid, or materials such as Cr which have a capability to be dissolved in a solution mainly including ammonium cerium nitrate, exhibit excellent wet-etching feature which allows easy wet-etching thereon, thus these materials are preferable for the conductive layers 11b and 15b. Table 1 shows electrode materials, specific resistances thereof, and available etchants therefor.

TABLE 1

| resistance Electrode material | Specific ($\mu\Omega \cdot cm$) | | Etchant |
|---|---|---|---|
| | Bulk | Thin-film | |
| ITO | — | 120 | various acid such as ferric chloride + hydrochloric acid, etc. |
| Cr | 12.9 | 30 | ammonium cerium nitrate solution |
| Al | 2.74 | 5 | various acids such as phosphoric acid, nitric acid, or acetic acid |
| Cu | 1.7 | 2.5 | various acids such as phosphoric acid, nitric acid, or acetic acid |
| Ag | 1.63 | — | — |
| Au | 2.2 | 3 | aqua regia or potassium iodide solution |
| Pt | 10.8 | — | aqua regia or potassium iodide solution |
| Pd | 10.6 | — | aqua regia or potassium iodide solution |
| Ni | 7.04 | 50 | various acids |
| Mo | 5.33 | 50 | various acids such as phosphoric acid, nitric acid, or acetic acid |
| Ta | 13.1 | 25($\alpha$) 200($\beta$) | hydrofluoric acid |
| W | 5.3 | — | hydrofluoric acid |
| Ti | 47 | 200 | hydrofluoric acid |

Material such as Cr, Mo, Ta, W or Ti which has higher melting point exhibit strong adhesion, which is preferable for the conductive layers 11b and 15b. Therefore, an elemental metal described above or an alloy thereof may be utilized for the conductive layers 11b and 15b.

Too great a thickness of the carrier relay layers 11a and 15a impairs low resistivity as well as the etching feature. Therefore, layer thickness of the carrier relay layer is preferably 1000 Å or less, and more preferably 500 Å or less. To the contrary, if the carrier relay layer is too thin, it may reduce an effect of decreasing the injection barrier in the organic semiconductor layer. However, the layer normally shows an effect even with a very small thickness. Therefore, the layer thickness of the carrier relay layer that is in contact with the organic semiconductor layer is preferably 1A or over, and more preferably 10 Å or over.

A deposition method for the source electrode and the drain electrode can be selected from the methods of vapor deposition, sputtering, CVD, and the like. Among the methods, sputtering is preferable from the viewpoints of easy use of material and simplicity of the deposition facility.

Patterning is carried out on the laminated layers after deposition so as to have a predetermined shape. Any method may be adopted for the patterning, however, a photo-etching process is preferably utilized. In the photo-etching process, a photo resist is firstly formed so as to have a predetermined pattern on the laminated layers, then wet-etching by using a solution or dry-etching by using a gas is carried out. Accordingly, laminated layers having desired pattern can be obtained after removing the photo resist.

When the etching feature of the carrier relay layer is different from that of the conductive layer, the etching process is carried out in two steps by using a suitable etching solution or a suitable etching gas for each laminated layer. It is preferable that the carrier relay layer and the conductive layer have a common etching feature, because the etching process can be carried out in one step by using a common etching solution or a common etching gas.

When embodying the present invention, the conductive layer selected for the bottom-contact type device differs a little from the conductive layer selected for the top-contact type device. However the lower specific resistance and the better etching feature are both necessary for either layer type.

As can be seen in FIG. 1, when the present invention is adapted to the bottom-contact type device, the source electrode and the drain electrode are laminated in the order of the conductive layer and the carrier relay layer. In this instance, adhesion of the conductive layer to the gate insulator layer 12 is important. On the other hand, when the present invention is adapted to the top-contact type device as shown in FIG. 2, the source electrode and the drain electrode are laminated in the order of the carrier relay layer and the conductive layer. Therefore, adhesion of the conductive layer to the gate insulator layer 12 is not important, but adhesion of the carrier relay layer to the gate insulator layer 12 is important.

Pentacene that is used for the organic semiconductor layer is a carrier transporting material, which has a high hole mobility. When the bottom-contact type device shown in FIG. 1 is fabricated by using pentacene for the organic semiconductor layer, a P-type device having a hole transporting property can be realized.

In the case that the carriers within the organic semiconductor layer are holes, a material having a hole transporting property or ambipolar transporting property to transport at least holes is necessary for the organic semiconductor such that the holes can be moved therethrough. In the case that the carriers are electrons, a material having an electron transporting property or ambipolar transporting property to transport at least electrons is necessary so that the electrons can be moved therethrough. An example of materials having a hole transporting property or ambipolar transporting property is copper-phthalocyanine or the like, and an example of electron transporting material is tris-8-hydroxyqunoline aluminum or the like.

A metal, which is used for the carrier relay layer provided in each layered electrode so as to contact with the organic semiconductor layer, is selected such that a work function is substantially the same as the ionized potential of the organic thin-film having a carrier transporting property. This is because application of a voltage is necessary for carrier mobility to reduce an energy difference that is caused by the energy barrier between materials that are in contact with each other. Specifically, low energy barrier is preferable for the carrier to move therethrough without suffering resistance. The ionized potential represents energy measured between the vacuum level and a High Occupied Molecular Orbital (HOMO) level corresponding to a highest level of a valence band. A metal or a metal oxide may be used for material of the carrier relay layer. The work function of such material represents energy measured between the vacuum level of 0 eV and the Fermi level. It should be noted that an ionized potential energy represents a work necessary for cationization which is carried out by applying a voltage across the material having a hole transporting property, and that an electron affinity energy represents a work necessary for anionization which is carried out by applying a voltage across the material having an electron transporting property.

An example of material having a higher work function, which is used for the carrier relay layer in the organic transistor according to the embodiment, is a metal such as gold with a work function over 4.51 eV, platinum, palladium, selenium or nickel, indium tin oxide that is hereinafter referred as ITO, iridium zinc oxide, zinc oxide and alloy thereof, stannic oxide, copper iodide, or the like.

On the other hand, an example of material having a lower work function, which is used for the carrier relay layer, is a metal such as silver with a work function of 4.51 eV or under, plumbum, stannum, aluminum, calcium, indium or chromium, alkali metal such as lithium, alkali-earth metal such as magnesium, alloy thereof, alkali metal compound, alkali-earth metal compound, or the like. Table 2 shows an example of a work function of material to be selected for utilization. The atomic symbol is shown in upper side of each cell in Table 2, whereas the work function is shown in lower side of the cell.

TABLE 2

| Li | Be | | | | | | | | | | | B | C | | |
|---|---|---|---|---|---|---|---|---|---|---|---|---|---|---|---|
| 2.39 | 3.37 | | | | | | | | | | | 4.5 | 4.39 | | |
| Na | Mg | | | | | | | | | | | Al | Si | | |
| 2.27 | 3.46 | | | | | | | | | | | 4.28 | 4.1 | | |
| K | Ca | Sc | Ti | V | Cr | Mn | Fe | Co | Ni | Cu | Zn | Ga | Ge | As | Se |
| 2.15 | 2.76 | 3.5 | 4.09 | 4.11 | 4.51 | 3.95 | 4.36 | 4.18 | 4.84 | 4.47 | 3.74 | 3.96 | 4.56 | 5.11 | 4.72 |
| Rb | Sr | Y | Zr | Nb | Mo | Tc | Ru | Rh | Pd | Ag | Cd | In | Sn | Sb | Te |
| 2.13 | 2.35 | 3.2 | 3.84 | 4.1 | 4.27 | | 4.52 | 4.65 | 4.82 | 4.28 | 3.92 | 4.12 | 4.11 | 4.08 | 4.73 |
| Cs | Ba | lanthanoid | Hf | Ta | W | Re | Os | Ir | Pt | Au | Hg | Tl | Pb | Bi | Po |
| 1.89 | 2.29 | 3.53 | 4.12 | 4.5 | 5.1 | 4.55 | 4.57 | 5.29 | 4.58 | 4.52 | 3.76 | 4.02 | 4.28 | | |

Fabrication of the device—Bottom-contact type devices and comparative devices for comparison were fabricated. Overall thickness of the laminated layers for the gate electrode and the drain electrode was standardized at 2000 Å for all embodiments and all comparative examples.

[First embodiment]—a bottom-contact type organic MOS-TFT as shown in FIG. 1 was fabricated by the following procedure:

(1) [Formation of the gate electrode]—Cr was deposited on a glass substrate at a layer thickness of 1000 Å by a sputtering method. Patterning was then performed on a photo resist mask AZ6112 made by Tokyo Ohka Kogyo Co., Ltd. over the Cr layer. The substrate was soaked in an aqueous solution including ammonium cerium nitrate and perchloric acid so as to dissolve and remove unnecessary portions of Cr that was not covered with the resist mask. The substrate was finally soaked in acetone to remove the resist mask, thereby obtaining a gate electrode having a predetermined pattern on the substrate.

(2) [Formation of the gate insulator layer]—SiO$_2$ was deposited at a layer thickness of 1000 Å on the gate electrode pattern already formed on the substrate by a sputtering method. Patterning was then formed on a photo resist mask AZ6112 made by Tokyo Ohka Kogyo Co., Ltd. over the SiO$_2$ layer. Unnecessary portions of SiO$_2$ that were not covered with the resist mask were removed by means of dry-etching on the substrate using CF$_4$ gas. Finally, the resist mask was removed by an O$_2$ plasma, thereby obtaining a gate insulator layer of SiO$_2$ having a predetermined pattern on the substrate.

(3) [Formation of the source electrode and the drain electrode]—Patterning was formed on a photo resist mask ZPN1100 made by Nippon Zeon Co., Ltd. over the gate insulator layer pattern already formed on the substrate. Then, Al as a conductive layer was deposited at a layer thickness of 1500 Å, thereafter Pd as a carrier relay layer was deposited at a layer thickness of 500 Å, by a sputtering method. The mask and the metal layers on the mask were then removed by a lift-off technique using acetone, thereby obtaining a source electrode and a drain electrode each having a predetermined pattern. A channel length and a channel width defined by the pattern of the source electrode and the drain electrode were 20 μm and 100 μm, respectively.

(4) [Formation of the organic semiconductor layer]—Pentacene was deposited on the electrode pattern already formed on the substrate by a resistive heating deposition method at a layer thickness of 500 Å by using a mask with a predetermined pattern and by heating the substrate at 60 degree C. so as to form an organic semiconductor layer. Accordingly, an organic MOS-TFT device was completed.

[Second Embodiment]—An organic MOS-TFT device was completed in exactly the same manner as the first embodiment except for thicknesses of Al as the conductive layer and Pd as the carrier relay layer having 1800 Å and 200 Å, respectively, in place of the thicknesses described in paragraph (3) of the first embodiment.

[Third embodiment]—An organic MOS-TFT device was completed in exactly the same manner as the first embodiment except for a deposition of Cr as a third metal layer at a layer thickness of 500 Å that is provided to improve the adhesion, followed by a deposition of Al as a conductive layer at a layer thickness of 1300 Å, and followed by a deposition of Pd as a carrier relay layer at a layer thickness of 200 Å, by means of a sputtering method, so as to form the source electrode and the drain electrode having three laminated layers, in place of the formation of the source electrode and the drain electrode described in paragraph (3) of the first embodiment.

[First comparative example]—An organic MOS-TFT device was completed in exactly the same manner as the first embodiment except for utilizing a source electrode and a drain electrode having an elemental metal layer which were formed by depositing Pd at a layer thickness of 2000 Å by means of a sputtering method, in place of the source electrode and the drain electrode described in paragraph (3) of the first embodiment.

[Fourth embodiment]—A device was fabricated by a deposition of Al as a conductive layer at a layer thickness of 1800 Å, followed by a deposition of Ni as a carrier relay layer at a layer thickness of 200 Å. Since Al and Ni exhibit a common etching feature, patterning on these laminated layers were both carried out by a photo-etching process. Specifically, an organic MOS-TFT device was completed in exactly the same manner as the first embodiment except for the following procedure in place of the procedure described in paragraph (3) of the first embodiment:

(3) [Formation of the source electrode and the drain electrode]—Al as a conductive layer was deposited at a layer thickness of 1800 Å, thereafter Ni as a carrier relay layer was deposited at a layer thickness of 200 Å, by a sputtering method, over the gate insulator layer pattern already formed on the substrate. Patterning was formed on a photo resist mask AZ6112 made by Tokyo Ohka Kogyo Co., Ltd. over the Al/Ni layers. The substrate was then soaked in a mixed acid including phosphoric acid and nitric acid so as to dissolve and remove unnecessary portions of Al/Ni that was not covered with the resist mask. The substrate was finally soaked in acetone to remove the resist mask, thereby obtaining a source electrode and a drain electrode having a predetermined pattern. A channel length and a channel width defined by the pattern of the source electrode and the drain electrode were 20 μm and 100 μm, respectively.

[Second comparative example]—An organic MOS-TFT device was completed in exactly the same manner as the first embodiment except for utilizing a source electrode and a drain electrode having an elemental metal layer which were formed by depositing Ni at a layer thickness of 2000 Å by means of a sputtering method, in place of the source electrode and the drain electrode described in paragraph (3) of the first embodiment.

[Fifth embodiment]—A top-contact type organic MOS-TFT as shown in FIG. 2 was fabricated by the following procedure:

(1) [Formation of the gate electrode]—Cr was deposited on a glass substrate at a layer thickness of 1000 Å by a sputtering method. Patterning was then formed on a photo resist mask AZ6112 made by Tokyo Ohka Kogyo Co., Ltd. over the Cr layer. The substrate was soaked in an aqueous solution including ammonium cerium nitrate and perchloric acid so as to dissolve and remove unnecessary portions of Cr that was not covered with the resist mask. The substrate was finally soaked in acetone to remove the resist mask, thereby obtaining a gate electrode having a predetermined pattern.

(2) [Formation of the gate insulator layer]—$SiO_2$ was deposited at a layer thickness of 1000 Å on the gate electrode pattern already formed on the substrate by a sputtering method. Patterning was then formed on a photo resist mask AZ6112 made by Tokyo Ohka Kogyo Co., Ltd. over the $SiO_2$ layer. Unnecessary portions of $SiO_2$ that were not covered with the resist mask were removed by means of dry-etching on the substrate using $CF_4$ gas. Finally, the resist mask was removed by an $O_2$ plasma, thereby obtaining a gate insulator layer of $SiO_2$ having a predetermined pattern.

(3) [Formation of the organic semiconductor layer]—Pentacene was deposited on the gate insulator layer pattern already formed on the substrate by a resistive heating deposition method at a layer thickness of 500 Å by using a mask and by heating the substrate at 60 degree C. so as to form an organic semiconductor layer.

(4) [Formation of the source electrode and the drain electrode]—Predetermined pattern of a source electrode and a drain electrode were formed on the organic semiconductor layer pattern already formed on the substrate by using a mask and by depositing Pd as a carrier relay layer at a layer thickness of 200 Å followed by depositing Al as a conductive layer at a layer thickness of 1800 Å, by a resistive heating deposition method. A channel length and a channel width defined by the pattern of the source electrode and the drain electrode formed by a mask were 20 μm and 100 μm, respectively. Accordingly, an organic MOS-TFT device was completed.

[Sixth embodiment]—An organic MOS-TFT was completed in exactly the same manner as the fifth embodiment except for thicknesses of Pd as a the carrier relay layer and Al as a conductive layer having 10 Å and 1990 Å, respectively, in place of the thicknesses described in paragraph (4) of the fifth embodiment.

[Third comparative example]—An organic MOS-TFT device was completed in exactly the same manner as the fifth embodiment except for utilizing a source electrode and a drain electrode having an elemental metal layer which were formed by depositing Pd at a layer thickness of 2000 Å by means of a mask vapor deposition, in place of the source electrode and the drain electrode described in paragraph (4) of the fifth embodiment.

[Adhesiveness of the source electrode and the drain electrode]—When forming the devices for the first through fourth embodiments and the first and second comparative examples, sample devices were simultaneously fabricated on which an $SiO_2$ gate insulator layer, and the source electrode and the drain electrode were deposited by a sputtering method so as to evaluate adhesiveness of the layers to the gate insulator layer of $SiO_2$ as a base layer. The adhesiveness was evaluated by the following procedure:

Eleven cuts with 1 mm pitch were made in both horizontal and vertical directions on the $SiO_2$ layer by using a utility knife so as to form a grid having 100 cells comprising 10 rows×10 columns.

An adhesive tape was pasted over the grid and the tape was pressed firmly.

The tape was removed with great force and the number of cells were counted which remained. Table 3 shows a result of the evaluation of adhesiveness. It should be noted that, in Table 3, material for the conductive layer and that for the carrier relay layer are shown in the described order in a column of laminated layer material, and in a column of adhesiveness, higher score designates stronger adhesion with maximum score being 100.

TABLE 3

| Sample | Laminated layer material Numerical value in ( ) shows layer thickness in Å | Adhesive-ness | Sheet resistance ($\Omega/\square$) | Electrical characteristic |
|---|---|---|---|---|
| 1st embodiment | Al(1500)/Pd(500) | 100 | 0.321 | The same as 1st comparative example |
| 2nd embodiment | Al(1800)/Pd(200) | 100 | 0.269 | The same as 1st comparative example |
| 3rd embodiment | Cr(500)/Al(1300)/Pd(200) | 100 | 0.368 | The same as 1st comparative example |
| 1st comparative example | Pd(2000) | 0 | 5.96 | — |
| 4th embodiment | Al(1800)/Ni(200) | 100 | 0.272 | The same as 2nd comparative example |
| 2nd comparative example | Ni(2000) | 100 | 9.63 | — |
| 5th embodiment | Pd(200)/Al(1800) | — | 0.276 | The same as 3rd comparative example |
| 6th embodiment | Pd(10)/Al(1990) | — | 0.251 | The same as 3rd comparative example |
| 3rd comparative example | Pd(2000) | — | 6.12 | — |

It was confirmed that adhesion of all embodiments are equal to or stronger than those of the comparative examples.

Adhesiveness shown in the first through third embodiments exhibits significant improvement as compared with the case of the elemental metal layer of Pd shown in the first comparative example.

[Resistivity of the laminated layer of the source electrode and the drain electrode]—When forming the devices for the embodiments and the comparative examples, sample devices are simultaneously fabricated on which an SiO$_2$ gate insulator layer, and the source electrode and the drain electrode are deposited by a sputtering method so as to evaluate specific resistivity of the layers. The specific resistivity as a sheet resistance ($\Omega$/□) was measured at a thickness of 2000 Å by a four-probe method. Results of the measurement of the specific resistivity are shown in Table 3. It was confirmed that all laminated layers according to the present invention have lower resistance than the elemental metal layer.

[Electrical characteristic of the organic MOS-TFT device]—An electrical current between the source electrode and the drain electrode was measured by varying a voltage between the source electrode and the drain electrode under the fixed voltage condition at the gate electrode for the organic MOS-TFTs which were fabricated as the embodiments and comparative examples. Results of the measurement are shown in Table 3, FIG. 3, FIG. 4 and FIG. 5.

Figure 3:
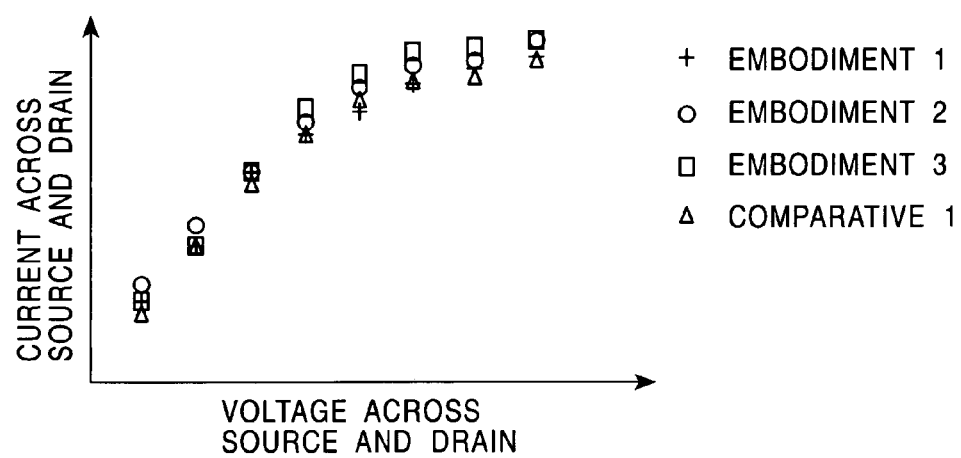
FIGS. 3–5 are graphs each showing current/voltage feature between a source electrode and a drain electrode of an organic transistor according to the present invention.
Figure 4:
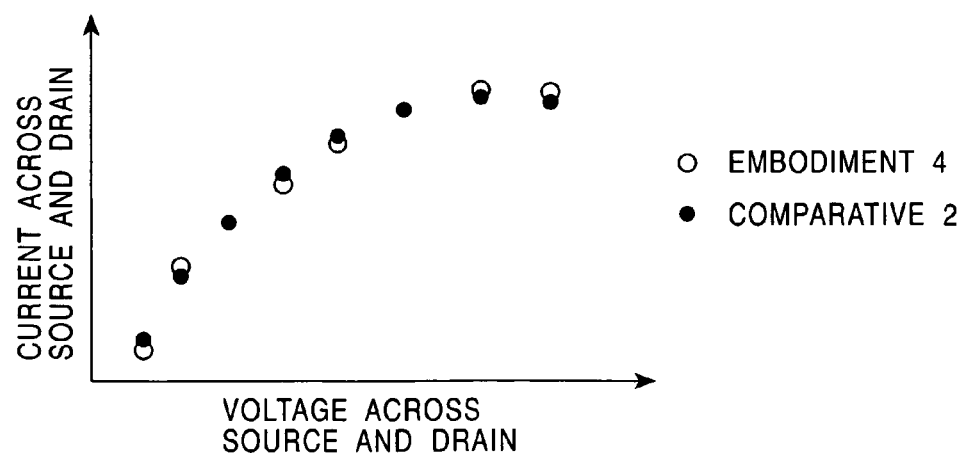
Figure 5:
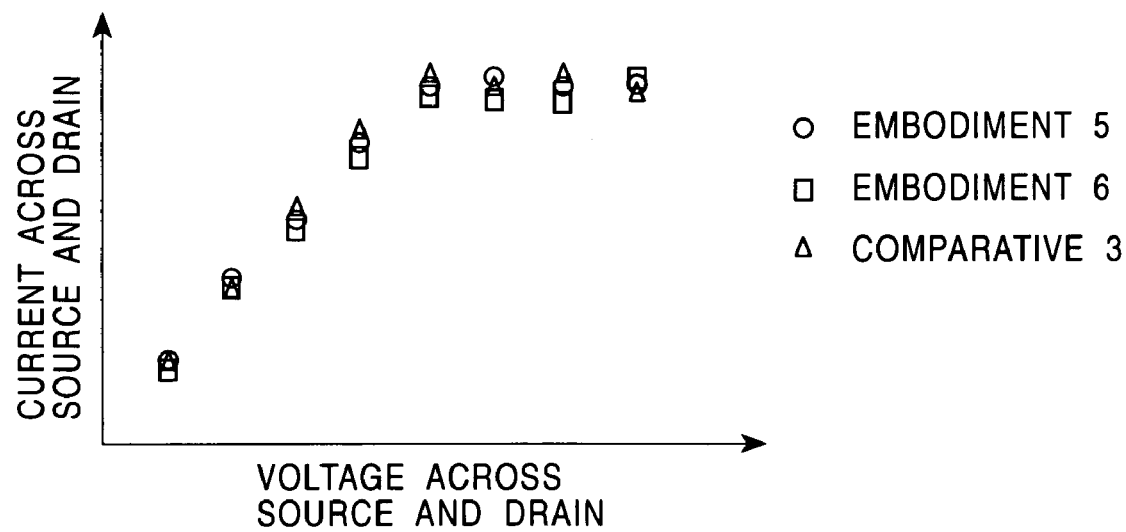

As can be seen in Table 3, FIG. 3, FIG. 4 and FIG. 5, it was confirmed that devices utilizing laminated layers of Al/Pd and laminated layers of Cr/Al/Pd for the source electrode and the drain electrode exhibited substantially the same characteristic as a device utilizing an elemental metal layer of Pd. It was also confirmed that devices utilizing laminated layers of Al/Ni for the source electrode and the drain electrode exhibited substantially the same characteristic as a device utilizing an elemental metal layer of Ni.

It was thus confirmed that at least one of the characteristics, i.e., the lower resistivity of the source electrode and the drain electrode and adhesion, was improved for devices according to the present invention, even though the electrical characteristic was substantially the same as the devices utilizing an elemental metal having a work function close or equal to the conventional organic semiconductor for the source electrode and the drain electrode.

Figure 6:
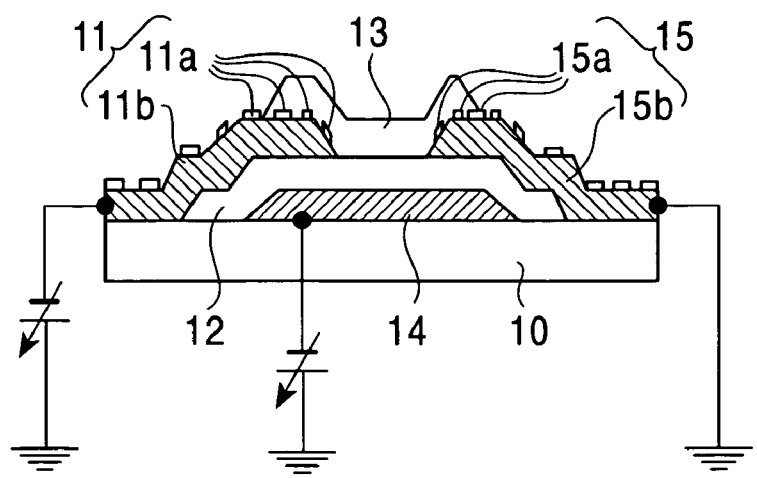
FIG. 6 is a cross sectional view showing an organic transistor according to another embodiment of the present invention.

FIG. 6 shows a bottom-contact type organic transistor according to another embodiment. When applying the present invention to the bottom-contact type device, the carrier relay layers 11a and 15a for the source electrode 11 and the drain electrode 15 may be configured to have island shapes with very thin thickness as shown in FIG. 6, and also the conductive layers 11b and 15b may be configured to have better etching feature, so that the patterning can be carried out easily on the source electrode and the drain electrode. Although, layer thickness of the carrier relay layers 11a and 15a having the island shape depends on material and a deposition method, 200 Å or less is preferable.

When the carrier relay layers 11a and 15a are configured to have an island structure, the etching process on the source electrode 11 and the drain electrode 15 each comprising the conductive layer and the carrier relay layer can be completed by only etching the conductive layer using an etching solution or an etching gas. This is because the island structure of the carrier relay layers permits immersion of the etching solution or the etching gas through an opening of the carrier relay layer having the island shape, thereby etching the conductive layer. As a result, the carrier relay layers are in a floating condition over the base layer, and then being removed. In this manner, etching may be completed in one step.

Although the present invention has been adapted to both electrodes, i.e., the source electrode and the drain electrode, in the aforementioned embodiments, the present invention may be adapted to only one electrode, whether the source electrode or the drain electrode, or may be adapted to an electrode for a double-pole organic transistor in addition to a triple-pole organic transistor. Furthermore, in addition to the embodiments shown in FIGS. 1 and 2, the present invention may be adapted to an organic semiconductor device having an arbitrary structure which provides a channel for an electrical current to flow in the order of the source electrode, the organic semiconductor, and the drain electrode.

Figure 7:
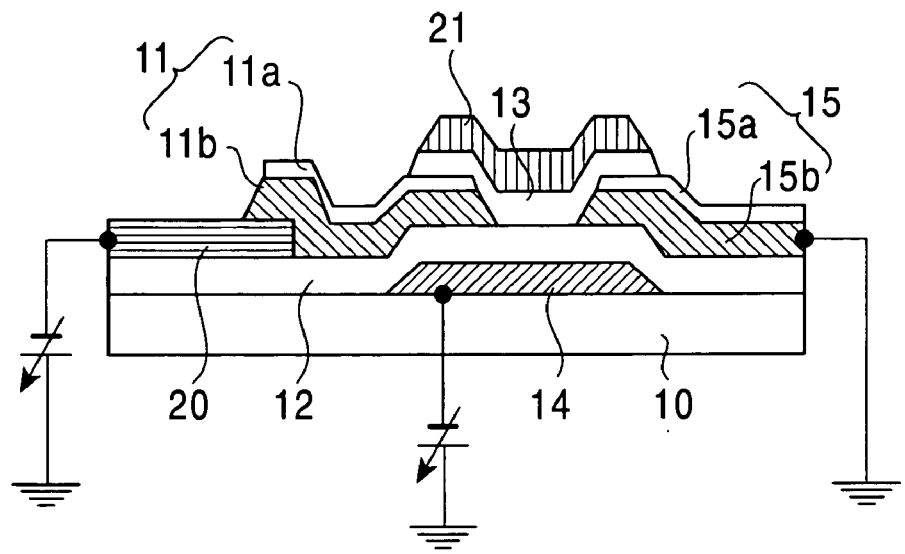
FIG. 7 is a cross-sectional view showing substrate structure of a display apparatus when an organic transistor according to another embodiment of the present invention is adapted to a TFT-LCD display apparatus.

Although the aforementioned embodiments have been described regarding the fabrication of a single piece TFT, the TFT according to the present invention maybe applied, for example, to driving of pixels for a display apparatus such as an LCD or an EL. Specifically, an active driving type display apparatus using the organic MOS-TFT according to the present invention may be provided by forming at least one organic transistor according to the present invention, other necessary devices such as a condenser, pixel electrodes, and the like on a common substrate. As an example, substrate structure of a display apparatus that applies features of the present invention to a TFT-LCD display apparatus is shown in FIG. 7. In such structure, a source electrode 11 comprising a carrier relay layer 11a and a conductive layer 11b is connected to a pixel electrode 20 of an LCD and an organic semiconductor layer 13 is covered with a protective layer 21.

Figure 8:
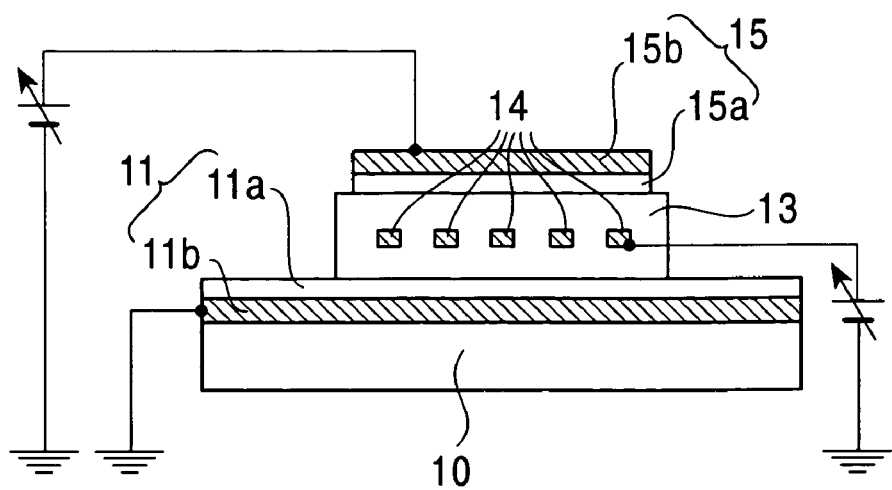
FIGS. 8–12 are cross sectional views each showing an organic transistor according to another embodiment of the present invention.

Furthermore, feature of the present invention may be adapted to a SIT (Static Induction Transistor) as an organic transistor having a vertical structure as shown in FIG. 8. The SIT has a capability to switch over an electrical current that flows in a thickness direction of a laminated layer. The SIT has a triple-terminal structure in which an organic semiconductor layer 13 sandwiched between carrier relay layers 11a and 15a, which are respectively included in the source electrode 11 and the drain electrode 15 each having a laminated layer structure comprising the carrier relay layer and the conductive layer. The SIT also includes porous gate electrodes 14 implanted at the middle of the organic semiconductor layer 13 in a thickness direction. An electrical current between the drain and the source can be controlled by means of a depletion layer generated within the organic semiconductor around the gate electrodes. The depletion layer is generated when a voltage is applied to the gate electrode 14.

Figure 9:
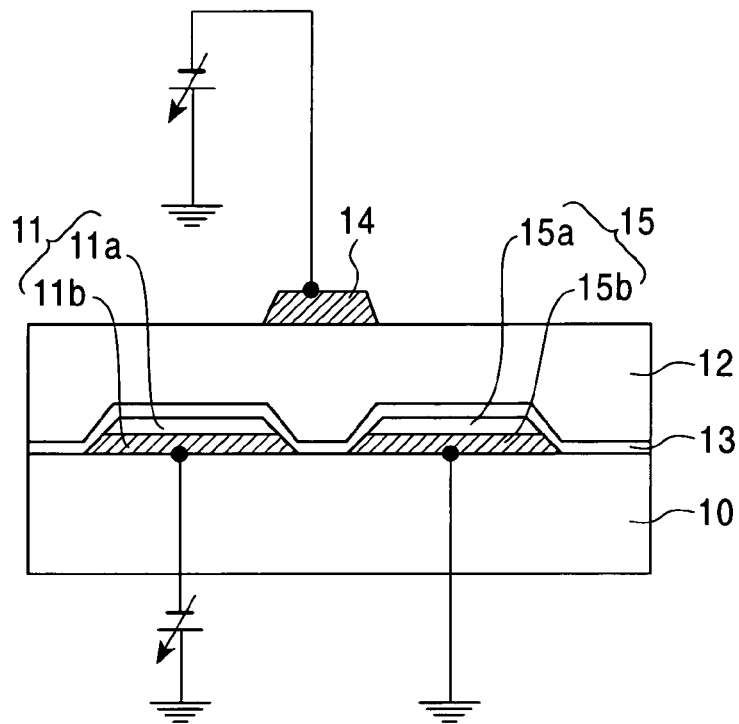

Alternatively, as shown in FIG. 9, the organic transistor may have a structure comprising a gate electrode 14, and a source electrode 11 and a drain electrode 15, which are laminated with respect to each other. The source electrode 11 and the drain electrode 15 respectively comprising conductive layers 11b and 15b, and carrier relay layers 11a and 15a are formed on a substrate 10, and thereafter, an organic semiconductor layer 13, a gate insulator layer 12, and a gate electrode 14 are formed in the described order, which is the reverse order of the configuration shown in FIG. 1.

Figure 10:
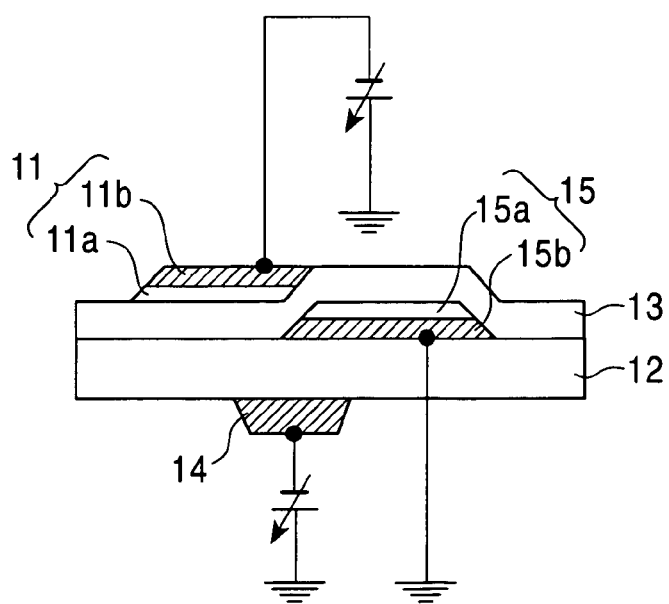

In a similar manner, as shown in FIG. 10, the organic transistor may have a structure such that a source electrode 11 and a drain electrode 15 respectively comprising conductive layers 11b and 15b, and carrier relay layers 11a and 15a are formed so as to sandwich an organic semiconductor layer 13 therebetween, and a gate electrode 14 is formed so as to be spaced apart therefrom via a gate insulator layer 12.

As described above, in an organic semiconductor device according to the embodiment, an electrode having relation to carrier mobility is configured to have laminated layers comprising a carrier relay layer having a work function close or equal to an ionized potential of the organic semiconductor, and a conductive layer having at least one better feature than the carrier relay layer in terms of adhesion, etching feature, and low resistance. Accordingly, an electron is injected into the organic semiconductor through the carrier relay layer having low barrier feature, thereby realizing an excellent electrical characteristic similar to the case that utilize an elemental metal layer. Furthermore, an organic semiconductor is realized which has at least one better feature in terms of adhesion, etching feature, and low resistance, than a case utilizing an electrode formed by an elemental metal layer. As a result, diversity of material combination for the electrode can be improved.

Figure 11:
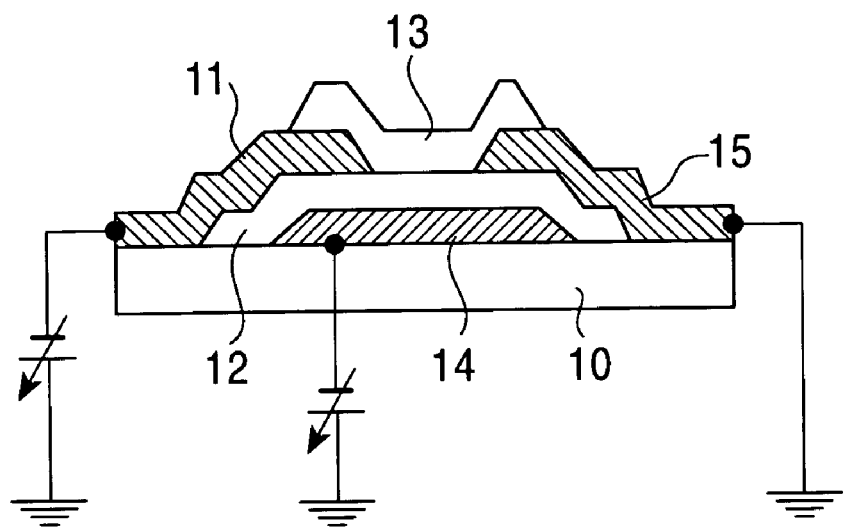

FIG. 11 shows a bottom-contact type organic transistor according to another embodiment. The organic transistor includes a gate electrode 14 formed on a substrate 10, a gate insulator layer 12 formed thereon, an organic semiconductor layer 13 formed thereon which is made of organic compound having carrier mobility such as pentacene, and a source electrode 11 and a drain electrode 15 which are both formed so as to contact with the organic semiconductor layer 13. The substrate 10 is made of material having an insulating property such as glass. The gate electrode 14 applies a voltage to the organic semiconductor layer 13 which is provided between the source electrode 11 and the drain electrode 15 facing each other.

Figure 12:
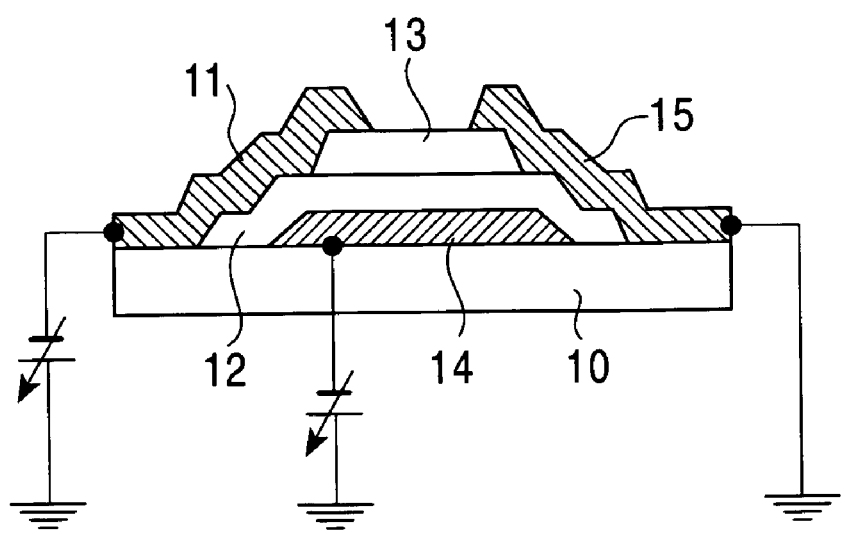

FIG. 12 shows a top-contact type organic transistor according to another embodiment. Structure of the top-contact type device is the same as that of the bottom-contact type shown in FIG. 11 except for the forming order that the organic semiconductor layer 13 is firstly deposited, thereafter the source electrode 11 and the drain electrode 15 are deposited thereon.

Material used for the organic semiconductor layer 13 and the gate electrode 14 is the same as that shown in the aforementioned embodiment.

It is required that a work function of material used for the source electrode 11 and the drain electrode 15 is close or equal to an ionized potential of the organic semiconductor, in order to decrease an electron injection barrier between the electrodes and the organic semiconductor. For example, as shown in FIG. 11, an alloy layer comprising two or more types of metals is used for each of the source electrode 11 and the drain electrode 15, so as to exhibit features that the work function become close or equal to the ionized potential of the organic semiconductor. Specifically, each alloy layer comprises a first metal having a work function close or equal to the ionized potential of the organic semiconductor layer 13, and a second metal having lower resistivity than the first metal.

It is especially important that the work function of the first metal exhibits a feature of being close or equal to the ionized potential of the organic semiconductor so that the carrier allow moving through the organic semiconductor. Therefore, it is preferable to provide the alloy layer by using a trace amount of metal layer as the first metal which includes at least one material having the work function close or equal to the ionized potential of the organic semiconductor, and by selecting material for the second metal which compensates for the features not achieved by the first metal. Such features are low resistivity for sufficient electrical current, better etching feature for minute patterning, and stronger adhesion throughout the layer to the base layer. When the alloy layer comprising two types of metals is not enough to improve such features, the alloy layer may comprise three or more types of metal to further improve the features.

A metal, an alloy or the like which includes at least one material having a work function close or equal to the ionized potential of the organic semiconductor is used for the first metal. The work function of the material included in the first metal is preferably within a range of ±1 eV, and more preferably within a range of ±0.5 eV with a center of the range corresponding to the ionized potential of the organic semiconductor to be utilized.

When, for example, pentacene that is a typical organic semiconductor material having an ionized potential at 5.06 eV is used for the organic semiconductor, a work function of the material included in the first metal is preferably within the range from 4.56 to 5.56 eV. Examples of metals satisfying the above property are Rh, Ir, Ni, Pd, Pt, Au, As, Se, Te and the like. An elemental metal described above or a plurality of such metals can be utilized for the first metal.

A metal having at least one excellent feature in terms of lower specific resistance than the first metal, better etching feature which permits minute pattering, and stronger adhesion throughout the layer to the base layer below the first metal, i.e., the gate insulator layer 12 in the case of FIG. 11, is used for the second metal.

Materials such as Al, Cu, Ag, Ni or Mo which have the capability to be dissolved in an acid mainly including a phosphoric acid, or materials such as Cr which have the capability to be dissolved in a solution mainly including ammonium cerium nitrate, exhibit excellent wet-etching feature which allows easy wet-etching thereon, thus these materials are preferable for the second metal. Electrode materials, specific resistances thereof, and available etchants therefor, shown in the aforementioned Table 1 may be utilized.

Materials such as Cr, Mo, Ta, W or Ti which have higher melting point exhibit strong adhesion, which is preferable for the second metal. Therefore, an elemental metal described above or an alloy thereof may be utilized for the second metal.

Too much content of the first metal mixed in the alloy layer impairs resistivity of the alloy layer, etching feature, and adhesion. Therefore, content of the first metal within the alloy is preferably 50 atom. % or below, and more preferably 20 atom. % or below, and most preferably 5 atom. % or below. To the contrary, too little content of the first metal may reduce an effect of decreasing the injection barrier to the organic semiconductor layer. However, the alloy normally shows an effect even with a trace amount. Therefore, content of the first metal within the alloy layer is preferably 0.01 atom. % or over, and more preferably 0.1 atom. % or over, and most preferably 0.5 atom. % or over.

Such alloy is utilized for the source electrode and the drain electrode in a form of thin-film alloy layer.

When the alloy layer is too thick, the etching feature is impaired. Therefore, layer thickness of the alloy layer is preferably in the range from 100 Å to 1 μm, and more preferably in the range from look to 3000 Å.

A deposition method for the source electrode and the drain electrode can be selected from the methods of co-deposition utilizing plural evaporation sources, sputtering, CVD, and the like. Among the methods, sputtering is preferable from the viewpoints of easy use of material, stability of composition for alloying, and simplicity of the deposition facility. Patterning is carried out on the alloy layer after deposition so as to have a predetermined shape. Any method may be adopted for the patterning, however, a photo-etching process is preferably utilized. In the photo-etching process, a photo resist is firstly formed so as to have a predetermined pattern on the alloy layers, then wet-etching by using a solution or dry-etching by using a gas is carried out. Accordingly, the alloy layer having desired pattern can be obtained after removing the photo resist.

A metal having a work function that is substantially the same as the ionized potential of the organic thin-film having the carrier transporting property is selected for the first metal of the alloy layer that is in contact with the organic semiconductor layer. This is because application of a voltage is necessary for carrier mobility to reduce an energy difference that is caused by the energy barrier between materials that are in contact with each other. Specifically, a low energy barrier is preferable for the carrier to move therethrough without suffering resistance.

An example of material having a higher work function, which is used for the first metal in the organic transistor according to the embodiment, is a metal such as gold with a work function over 4.51 eV, platinum, palladium, selenium or nickel.

On the other hand, an example of material having a lower work function, which is used for the first metal, is a metal such as silver with a work function of 4.51 eV or under, plumbum, stannum, aluminum, calcium, indium, chromium, alkali metal such as lithium, alkali-earth metal such as magnesium, or the like. Materials shown in the aforementioned Table 2 may be used.

Fabrication of the device—Bottom-contact type devices and comparative devices for comparison were fabricated.

[Seventh embodiment]—A bottom-contact type organic MOS-TFT as shown in FIG. 11 was fabricated by the following procedure:

(1) [Formation of the gate electrode]—Cr was deposited on a glass substrate at a layer thickness of 1000 Å by a sputtering method. Patterning was then performed on a photo resist mask AZ6112 made by Tokyo Ohka Kogyo Co., Ltd. over the Cr layer. The substrate was soaked in an aqueous solution including ammonium cerium nitrate and perchloric acid so as to dissolve and remove unnecessary portions of Cr that was not covered with the resist mask. The substrate was finally soaked in acetone to remove the resist mask, thereby obtaining a gate electrode having a predetermined pattern on the substrate.

(2) [Formation of the gate insulator layer]—$SiO_2$ was deposited at a layer thickness of 1000 Å on the gate electrode pattern already formed on the substrate by a sputtering method. Patterning was then formed on a photo resist mask AZ6112 made by Tokyo Ohka Kogyo Co., Ltd. over the $SiO_2$ layer. Unnecessary portions of $SiO_2$ that were not covered with the resist mask were removed by means of dry-etching on the substrate using $CF_4$ gas. Finally, the resist mask was removed by an $O_2$ plasma, thereby obtaining a gate insulator layer of $SiO_2$ having a predetermined pattern on the substrate.

(3) [Formation of the source electrode and the drain electrode]—An Ag—Pd alloy layer was deposited at a layer thickness of 1000 Å using an Ag—Pd alloy target including pd as a first metal at 0.1 atom. % on the gate electrode pattern already formed on the substrate by a sputtering method. Patterning was then formed on a photo resist mask AZ6112 made by Tokyo Ohka Kogyo Co., Ltd. over the Ag—Pd layer. The substrate was soaked in a mixed acid including phosphoric acid, nitric acid, and acetic acid so as to dissolve and remove unnecessary portions of Ag—Pd that was not covered with the resist mask. The substrate was finally soaked in acetone to remove the resist mask, thereby obtaining a source electrode and a drain electrode each having a predetermined pattern. A channel length and a channel width defined by the pattern on the source electrode and the drain electrode were 20 µm and 100 µm, respectively.

(4) [Formation of the organic semiconductor layer]—Pentacene was deposited on the electrode pattern already formed on the substrate by a resistive heating deposition method at a layer thickness of 500 Å by using a mask with a predetermined pattern and by heating the substrate at 60 degree C. so as to form an organic semiconductor layer. Accordingly, an organic MOS-TFT device was completed.

[Eighth embodiment]—An organic MOS-TFT device was completed in exactly the same manner as the seventh embodiment except for forming the source electrode and the drain electrode by Ag—Pd alloy layers including Pd at 1.0 atom. %, in place of the alloy described in paragraph (3) of the seventh embodiment.

[Ninth embodiment]—An organic MOS-TFT device was completed in exactly the same manner as the seventh embodiment except for forming the source electrode and the drain electrode by Ag—Pd alloy layers including Pd at 5.0 atom. %, in place of the alloy described in paragraph (3) of the seventh embodiment.

[Tenth embodiment]—An organic MOS-TFT device was completed in exactly the same manner as the seventh embodiment except for forming the source electrode and the drain electrode by Ag—Pd—Cu alloy layers including Pd at 1.0 atom. % and Cu at 0.5 atom. %, in place of the alloy described in paragraph (3) of the seventh embodiment.

FOURTH COMPARATIVE EXAMPLE

A device was fabricated by forming a source electrode and a drain electrode with Pd. Since selective etching on Pd without damaging a Cr layer provided under the Pd layer was difficult, patterning on the Cr was carried out by a lift-off method. Specifically, an organic MOS-TFT device was completed in exactly the same manner as the seventh embodiment except for the following procedure in place of the procedure described in paragraph (3) of the seventh embodiment:

(3) [Formation of the source electrode and the drain electrode]—Patterning was formed on a photo resist mask ZPN1100 made by Nippon Zeon Co., Ltd. over the gate insulator layer pattern already formed on the substrate. Pd as a source electrode and a drain electrode was then deposited at a layer thickness of 1000 Å by a sputtering method. The source electrode and the drain electrode each having a predetermined pattern were obtained by a lift-off technique using acetone. A channel length and a channel width defined by the pattern on the source electrode and the drain electrode were 20 µm and 100 µm, respectively.

FIFTH COMPARATIVE EXAMPLE

An organic MOS-TFT device was completed in exactly the same manner as the seventh embodiment except for forming the source electrode and the drain electrode by Ag, in place of material described in paragraph (3) of the seventh embodiment.

[Eleventh embodiment]—An organic MOS-TFT device was completed in exactly the same manner as the seventh embodiment except for forming the source electrode and the drain electrode by Al—Ni alloy layers including Ni as a first metal at 2 atom. %, in place of the alloy described in paragraph (3) of the seventh embodiment.

[Twelfth embodiment]—An organic MOS-TFT device was completed in exactly the same manner as the seventh embodiment except for forming the source electrode and the drain electrode by Al—Ni alloy layers each including Ni at 5 atom. %, in place of the alloy described in paragraph (3) of the seventh embodiment.

SIXTH COMPARATIVE EXAMPLE

An organic MOS-TFT device was completed in exactly the same manner as the seventh embodiment except for forming the source electrode and the drain electrode by Ni, in place of material described in paragraph (3) of the seventh embodiment.

SEVENTH COMPARATIVE EXAMPLE

An organic MOS-TFT device was completed in exactly the same manner as the seventh embodiment except for forming the source electrode and the drain electrode by Al, in place of material described in paragraph (3) of the seventh embodiment.

[Adhesiveness of the source electrode and the drain electrode]—When forming the devices for the embodiments and the comparative examples, sample devices were simultaneously fabricated on which an $SiO_2$ gate insulator layer, and the source electrode and the drain electrode were deposited by a sputtering method so as to evaluate adhesiveness of the layers to the gate insulator layer of $SiO_2$ as a base layer. The adhesiveness was evaluated by the following procedure:

Eleven cuts with 1 mm pitch were made in both horizontal and vertical directions on the $SiO_2$ layer by using a utility knife so as to form a grid having 100 cells comprising 10 rows×10 columns.

An adhesive tape was pasted over the grid and the tape was pressed firmly.

The tape was removed with great force and the number of cells were counted. Table 4 shows a result of the evaluation of adhesiveness. It should be noted that, in Table 4, material of the second metal and the first metal is shown in the described order with the numeral value designating material content in a column of electrode material, and in a column of adhesiveness, higher score designates stronger adhesion with maximum score being 100.

TABLE 4

| Sample | Electrode material | Adhesiveness | Sheet resistance (Ω/□) | Electrical characteristic |
|---|---|---|---|---|
| 7th embodiment | Ag-0.1Pd | 100 | 0.242 | The same as 4th comparative example |
| 8th embodiment | Ag-1Pd | 100 | 0.278 | The same as 4th comparative example |
| 9th embodiment | Ag-5Pd | 100 | 0.478 | The same as 4th comparative example |
| 10th embodiment | Ag-1Pd-0.5Cu | 100 | 0.311 | The same as 4th comparative example |
| 4th comparative example | Pd | 0 | 3.08 | — |
| 5th comparative example | Ag | 100 | 0.223 | Inferior to 4th comparative example |
| 11th embodiment | Al-2Ni | 100 | 0.882 | The same as 6th comparative example |
| 12th embodiment | Al-5Ni | 100 | 1.54 | The same as 7th comparative example |
| 6th comparative example | Ni | 100 | 4085 | — |
| 7th comparative example | Al | 100 | 0.509 | Inferior to 6th comparative example |

It was confirmed that adhesions of all embodiments are equal to or stronger than those of the comparative examples. Adhesiveness exhibits significant improvement in the case of noble metal such as Pd by virtue of alloying.

[Resistivity of the alloy layer of the source electrode and the drain electrode]—When forming the devices for the embodiments and the comparative examples, sample devices are simultaneously fabricated on which an $SiO_2$ gate insulator layer, and the source electrode and the drain electrode are deposited by a sputtering method so as to evaluate specific resistivity of the layers. The specific resistivity as a sheet resistance (Ω/□) was measured at a thickness of 1000 Å by a four-probe method. Results of the measurement of the specific resistivity are shown in Table 4. It is confirmed that all alloy layers according to the present invention have lower resistance than the elemental metal layers comprising the first metal.

Figure 13:
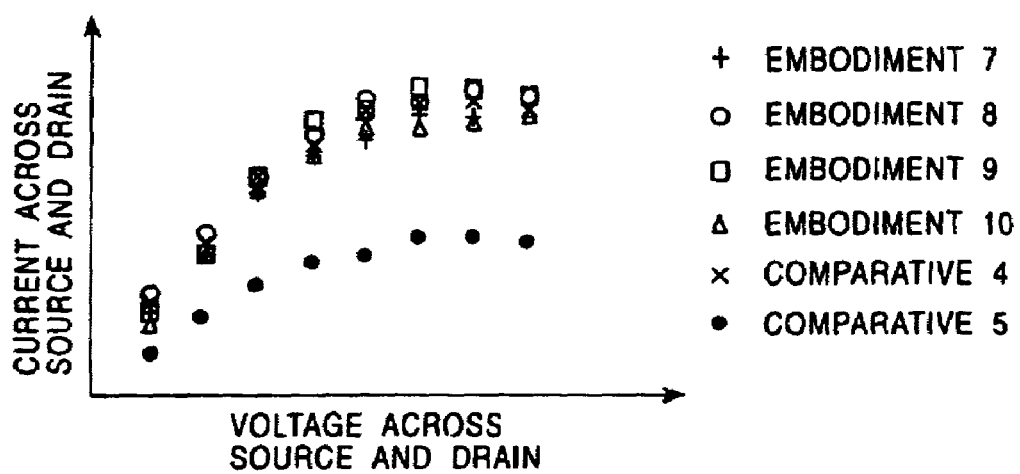
FIGS. 13 and 14 are graphs each showing current/voltage feature between a source electrode and a drain electrode of an organic transistor according to the present invention.
Figure 14:
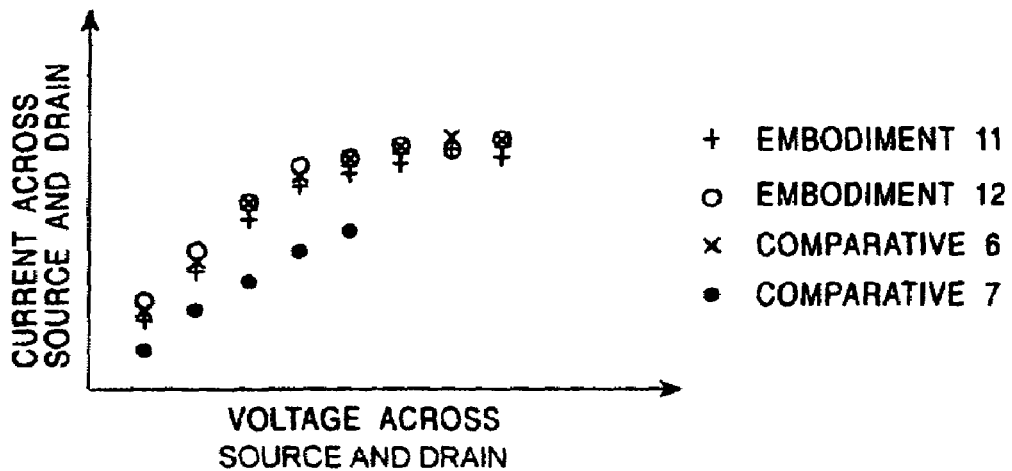

[Electrical characteristic of the organic MOS-TFT device]—An electrical current between the source electrode and the drain electrode was measured by varying a voltage between the source electrode and the drain electrode under the fixed voltage condition at the gate electrode for the organic MOS-TFTs which were fabricated as the embodiments and comparative examples. Results of the measurement are shown in Table 4, FIG. 13 and FIG. 14.

It was confirmed that devices utilizing alloy layers of Ag—Pd and Ag—Pd—Cu for the source electrode and the drain electrode exhibited substantially the same characteristic as a device utilizing an elemental metal layer of Pd, and exhibited better characteristic when compared with a device utilizing Ag. It was also confirmed that devices utilizing alloy layers of Al—Ni for the source electrode and the drain electrode exhibited substantially the same characteristic as a device utilizing an elemental metal layer of Ni, and exhibited better characteristic when compared with a device utilizing Al.

It was thus confirmed that at least one of the characteristics, i.e., the lower resistivity of the source electrode and the drain electrode, etching feature and adhesion, was improved for devices according to the present invention, even though the electrical characteristic was substantially the same as the devices utilizing an elemental metal having a work function close or equal to the conventional organic semiconductor for the source electrode and the drain electrode. It was also confirmed that the device according to the embodiment had better electrical characteristic as compared with the case that utilize an elemental metal such as Ag or Al for the source electrode and the drain electrode.

Although the alloy layer has been adapted to both electrodes, i.e., the source electrode and the drain electrode., in the aforementioned embodiments, the alloy layer may be adapted to only one electrode, whether the source electrode or the drain electrode, or may be adapted to an electrode for a double-pole organic transistor in addition to a triple-pole organic transistor. Furthermore, in addition to the embodiments shown in FIGS. 11 and 12, the alloy layer may be adapted to an organic semiconductor device having an arbitrary structure which provides a channel for an electrical current to flow in the order of the source electrode, the organic semiconductor, and the drain electrode.

Figure 15:
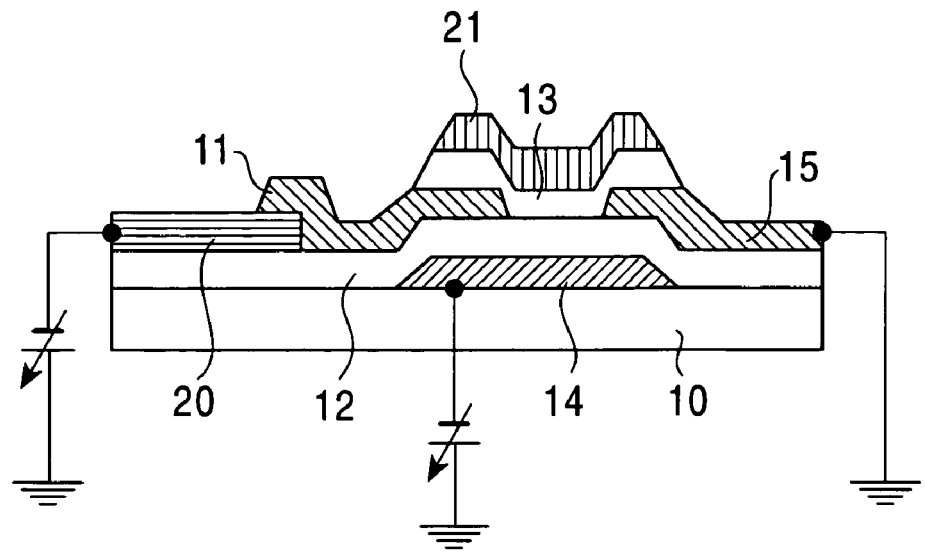
FIG. 15 is a cross-sectional view showing substrate structure of a display apparatus when an organic transistor according to another embodiment of the present invention is adapted to a TFT-LCD display apparatus.

Although the aforementioned embodiments have been described regarding the fabrication of a single piece TFT, the TFT according to the present invention may be applied, for example, to driving of pixels for a display apparatus such as an LCD or an EL. Specifically, an active driving type display apparatus using the organic MOS-TFT according to the present invention may be provided by forming at least one organic transistor according to the present invention, other necessary devices such as a condenser, pixel electrodes, and the like on a common substrate. As an example, substrate structure of a display apparatus that applies features of the present invention to a TFT-LCD display apparatus is shown in FIG. 15. In such structure, a source electrode 11 comprising an alloy layer of a first metal and a second metal is connected to a pixel electrode 20 of an LCD and an organic semiconductor layer 13 is covered with a protective layer 21.

Figure 16:
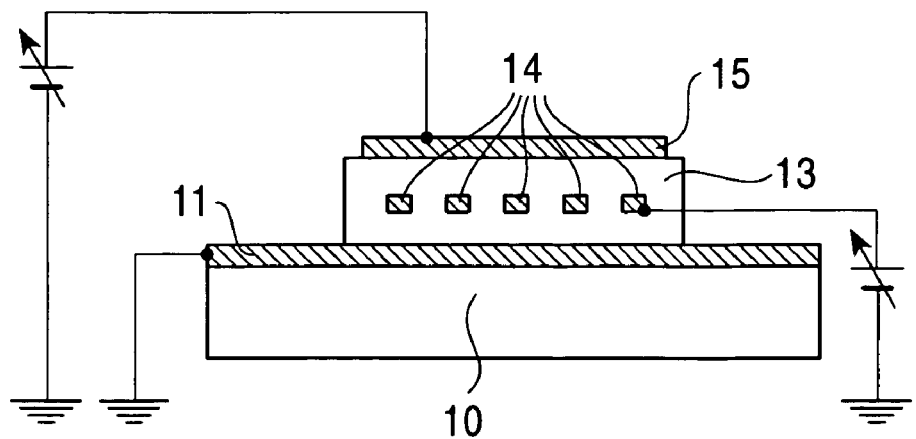
FIGS. 16–18 are cross sectional views each showing an organic transistor according to another embodiment of the present invention.

Furthermore, feature of the present invention may be adapted to a SIT (Static Induction Transistor) as an organic transistor having a vertical structure as shown in FIG. 16. The SIT has a capability to switch over an electrical current that flows in a thickness direction of an alloy layer. The SIT has a triple-terminal structure in which an organic semiconductor layer 13 sandwiched between a source electrode 11 and a drain electrode 15 each comprising an alloy layer of a first metal and a second metal. The SIT also has porous gate electrodes 14 implanted at the middle of the organic semiconductor layer 13 in a thickness direction. An electrical current between the drain and the source can be controlled by means of a depletion layer generated within the organic semiconductor around the gate electrodes. The depletion layer is generated when a voltage is applied to the gate electrode 14.

Figure 17:
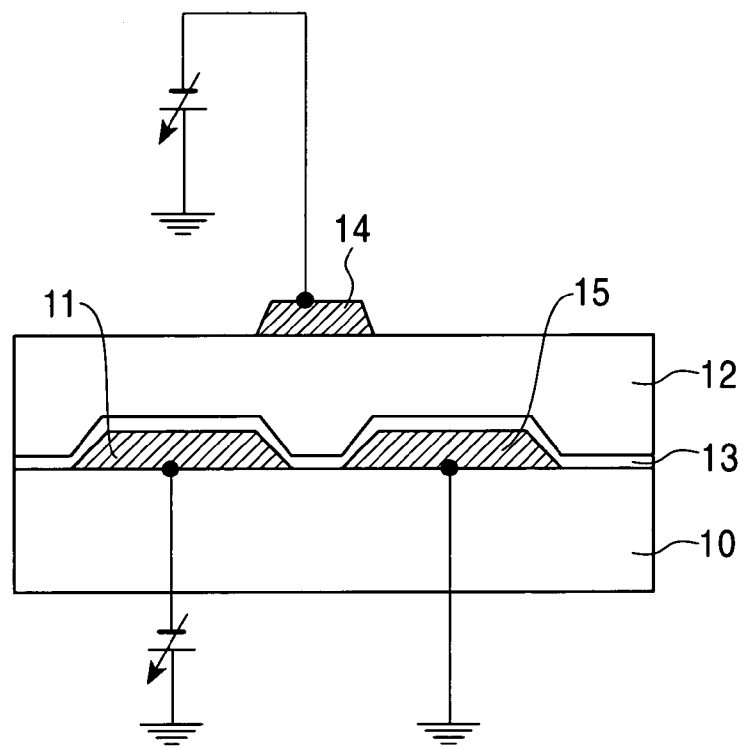

Alternatively, as shown in FIG. 17, the organic transistor may have a structure comprising a gate electrode 14, and a source electrode 11 and a drain electrode 15, which are laminated with respect to each other. The source electrode 11 and the drain electrode 15 each comprising an alloy layer of a first metal and a second metal are formed on a substrate 10, and thereafter, an organic semiconductor layer 13, a gate insulator layer 12, and a gate electrode 14 are formed in the described order, which is the reverse order of the configuration shown in FIG. 11.

Figure 18:
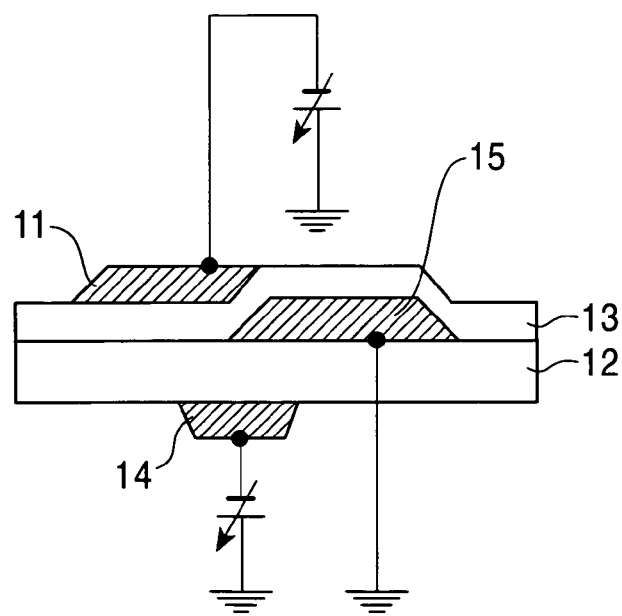

In a similar manner, as shown in FIG. 18, the organic transistor may have a structure such that a source electrode 11 and a drain electrode 15 each comprising an alloy layer of a first metal and a second metal are formed so as to sandwich an organic semiconductor layer 13 therebetween, and a gate electrode 14 is formed so as to be spaced apart therefrom via a gate insulator layer 12.

As described above, in an organic semiconductor device according to the embodiment, an electrode having a function of carrier mobility is configured to have an alloy layer comprising a first metal having a work function close or equal to an ionized potential of the organic semiconductor, and a second metal having at least one different feature from the first metal in terms of adhesion, etching feature, and low resistance. Accordingly, an electron is injected into the organic semiconductor through the first metal having low barrier feature, thereby achieving an excellent electrical characteristic similar to the case comprising an elemental metal layer of the first metal. Furthermore, an organic semiconductor is achieving at least one different feature in terms of adhesion, etching feature, and low resistance, as compared with a case utilizing an electrode formed by an elemental metal layer of the first metal. As a result, diversity of material combination for the electrode can be improved.

It is understood that the foregoing description and accompanying drawings set forth the preferred embodiments of the invention at the present time. Various modifications, additions and alternative designs will, of course, become apparent to those skilled in the art in light of the foregoing teachings without departing from the spirit and scope of the disclosed invention. Thus, it should be appreciated that the invention is not limited to the disclosed embodiments but may be practiced within the full scope of the appended claims.

This application is based on Japanese patent applications Nos. 2002-208210 and 2002-208211 which are herein incorporated by reference.

What is claimed is:

1. An organic semiconductor device comprising:
an organic semiconductor layer with carrier mobility deposited between a pair of electrodes facing each other,
wherein at least one of the electrodes includes an alloy layer in contact with the organic semiconductor layer, the alloy layer includes a first metal including a
work function at least one of close to and substantially equal to an ionized potential of the organic semiconductor layer, and a second metal including lower resistivity than the first metal.

2. An organic semiconductor device according to claim 1, wherein the first metal includes has a work function within a range of ±1 eV with a center of the range corresponding to the ionized potential of the organic semiconductor.

3. An organic semiconductor device according to claim 2, wherein the first metal includes has a work function within a range ±0.5 eV with a center of the range corresponding to the ionized potential of the organic semiconductor.

4. An organic semiconductor device according to claim 1, wherein the alloy layer includes has a layer thickness in the range from 100 Å to 1 µm.

5. An organic semiconductor device according to claim 4, wherein the alloy layer includes hen a layer thickness in the range from 100Å to 3000 Å.

6. An organic semiconductor device according to claim 1, wherein content of the first metal within the alloy layer is at least 0.01 atom. %, preferably at least 0.1 atom. %, and more preferably at least 0.5 atom. %, and a maximum of 50 atom. %, and preferably a maximum of 20 atom. %, and more preferably a maximum of 5 atom. %.

7. An organic semiconductor device according to claim 1, wherein the pair of electrodes includes are a source electrode and a dmin electrode, the organic semiconductor layer is deposited between the source electrode and the drain electrode so as to form a channel, and the organic semiconductor device further includes a gate electrode which applies a voltage to the organic semiconductor layer formed between the source electrode and the drain electrode.

8. An organic semiconductor device according to claim 7, further including a gate insulator layer which ctccirically insulates she gate electrode from the source electrode and the drain electrode.

9. An organic semiconductor devicc according to claim 7, wherein the source electrode and the drain clectrode are both provided on one side of the organic semiconductor layer.

10. An organic semiconductor device according to claim 7, wherein the source electrode and the drain electrode are respectively provided on opposite sides of the organic semiconductor layer so as to sandwich the layer therebetween.

11. An organic semiconductor device according to claim 8, wherein, the second material having stronger adhesion to the gate insulator layer than the first metal when the gate insulator layer is in contact with the alloy layer.

12. An organic semiconductor device according to claim 1, wherein the pair of electrodes includes are a source electrode and drain electrode, the organic semiconductor layer is deposited in a layer thickness direction so as to be sandwiched between the source electrode and the drain electrode, and the organic semiconductor device further includes a gate electrode which is implanted within the organic semiconductor layer.

13. An organic semiconductor device according to claim 12, wherein the gale electrode implanted within the organic semiconductor layer includes has one of a lattice, comb, and rattan blind shape.

* * * * *